(12) United States Patent
Yanagiuchi et al.

(10) Patent No.: US 10,242,520 B2
(45) Date of Patent: Mar. 26, 2019

(54) PAPER SHEET MAGNETIC DETECTION APPARATUS

(71) Applicant: GLORY LTD., Himeji-shi, Hyogo (JP)

(72) Inventors: Takahiro Yanagiuchi, Himeji (JP); Masafumi Chikamori, Himeji (JP); Jun Hisanaga, Himeji (JP)

(73) Assignee: GLORY LTD., Himeji-shi (JP)

(*) Notice: Subject to any disclaimer, the term of this patent is extended or adjusted under 35 U.S.C. 154(b) by 117 days.

(21) Appl. No.: 14/464,112

(22) Filed: Aug. 20, 2014

(65) Prior Publication Data

US 2015/0115947 A1 Apr. 30, 2015

(30) Foreign Application Priority Data

Oct. 30, 2013 (JP) .................................. 2013-224946

(51) Int. Cl.
*G01D 7/04* (2006.01)
*G07D 7/04* (2016.01)
(Continued)

(52) U.S. Cl.
CPC ............... *G07D 7/04* (2013.01); *B65G 39/02* (2013.01); *G01R 33/02* (2013.01)

(58) Field of Classification Search
CPC .......... G07D 7/04; G01R 33/06; G01R 33/07; G01R 33/09; G01R 33/091; G01R 33/093;
(Continued)

(56) References Cited

U.S. PATENT DOCUMENTS 3,245,534 A * 4/1966 Smith ...................... G07D 7/00
194/206
5,992,601 A * 11/1999 Mennie ................... G07D 7/00
194/207
(Continued)

FOREIGN PATENT DOCUMENTS

JP 2004-348404 A 12/2004
JP 2006-331385 A 12/2006
(Continued)

OTHER PUBLICATIONS

Machine English translation of the description of JP2010146162, obtained on Feb. 12, 2017, obtained from the EPO website (https://worldwide.espacenet.com/advancedSearch?locale=en_EP).*
(Continued)

*Primary Examiner* — David M Schindler
(74) *Attorney, Agent, or Firm* — Foley & Lardner LLP

(57) ABSTRACT

The object is to avoid degradation of magnetic detection precision arising due to magnetization of transport rollers used for transporting a paper sheet. A paper sheet magnetic detection apparatus that detects a magnetic material in the paper sheet by using a magnetic sensor includes a transport path that transports paper sheets one by one; at least one magnet that is used in the detection of the magnetic material by the magnetic sensor; and a plurality of transport rollers that are arranged near the magnetic sensor and that transport the paper sheet in the transport path. Outer peripheral surfaces of the plurality of transport rollers that face the transport path are made of a non-magnetic material.

15 Claims, 7 Drawing Sheets

(51) Int. Cl.
 *G01R 33/02* (2006.01)
 *B65G 39/02* (2006.01)

(58) Field of Classification Search
 CPC .. G01R 33/095; G01R 33/096; G01R 33/098;
  G01R 33/12; G01R 33/16; G01R 33/162;
  G01R 33/164; G01R 33/168
 See application file for complete search history.

(56) References Cited

U.S. PATENT DOCUMENTS

| | | | | |
|---|---|---|---|---|
| 6,278,270 | B1* | 8/2001 | Robles-Flores | B41J 11/0095 |
| | | | | 271/265.04 |
| 7,551,764 | B2* | 6/2009 | Chiles | G07D 9/04 |
| | | | | 194/205 |
| 2002/0097937 | A1* | 7/2002 | Obara | F16C 33/62 |
| | | | | 384/492 |
| 2005/0201789 | A1* | 9/2005 | Yuminamochi | G03G 15/657 |
| | | | | 399/390 |
| 2006/0186198 | A1 | 8/2006 | Terao et al. | |
| 2009/0136246 | A1* | 5/2009 | Murakami | G03G 15/5029 |
| | | | | 399/45 |
| 2009/0163122 | A1* | 6/2009 | Watanabe | B24B 7/13 |
| | | | | 451/57 |
| 2011/0233277 | A1* | 9/2011 | Schutzmann | G07D 7/04 |
| | | | | 235/450 |
| 2014/0116840 | A1 | 5/2014 | Maekawa et al. | |

FOREIGN PATENT DOCUMENTS

| | | |
|---|---|---|
| JP | 2009-163336 A | 7/2009 |
| JP | 2010-146162 | 7/2010 |
| KR | 100699498 B1 * | 3/2007 |
| RU | 2 344 063 C2 | 1/2009 |
| RU | 2 473 129 C1 | 1/2013 |
| WO | WO 2011/096258 | 8/2011 |
| WO | WO 2013/042407 A1 | 3/2013 |

OTHER PUBLICATIONS

European Search Report (Application No. 14182507.5) (5 pages—dated Feb. 27, 2015).

* cited by examiner

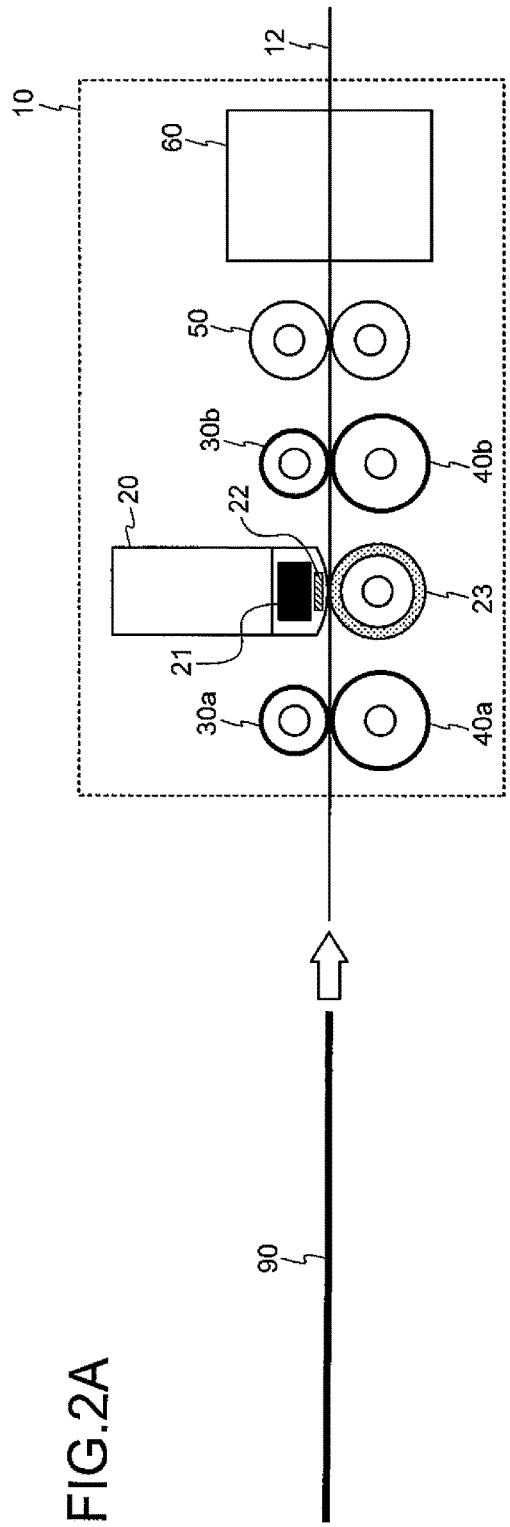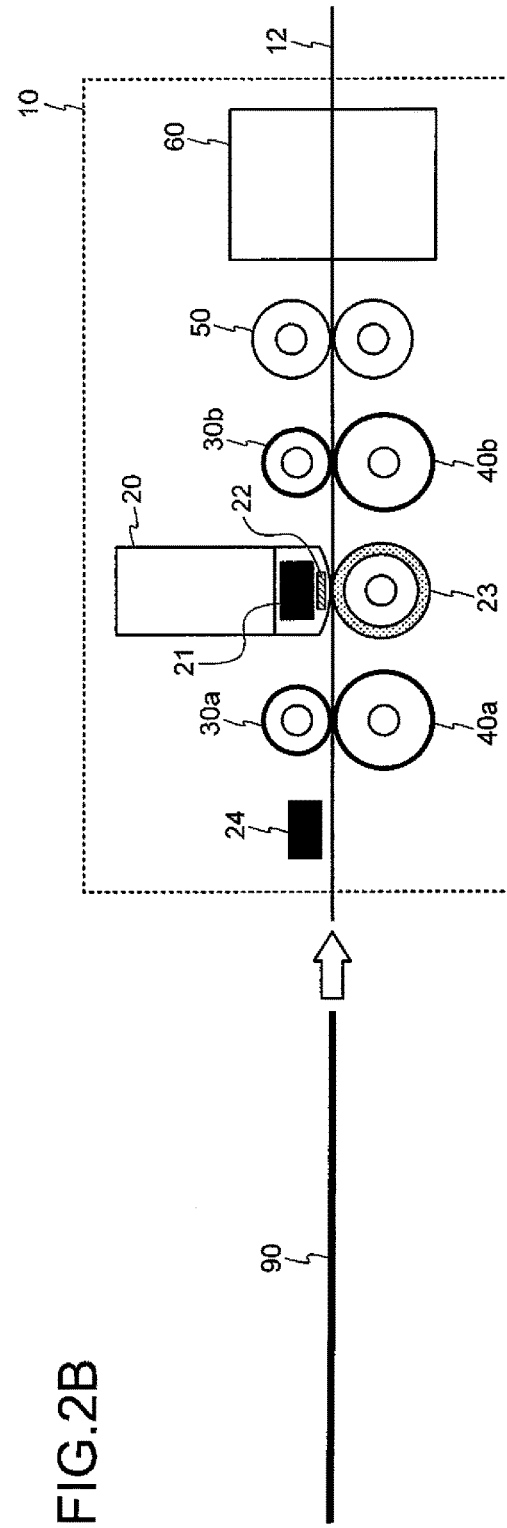

PAPER SHEET MAGNETIC DETECTION APPARATUS

TECHNICAL FIELD

The present invention relates to a paper sheet magnetic detection apparatus that can detect magnetic characteristics of a paper sheet while transporting the paper sheet.

BACKGROUND ART

In typical banknote handling apparatuses used in financial institutions and the like, banknotes taken in the apparatus are subjected to denomination recognition or authenticity recognition by a banknote recognition apparatus incorporated in the banknote handling apparatus. The banknote recognition apparatus includes a line sensor that acquires an image of a banknote that is being transported on a transport path, a thickness detecting sensor that detects a thickness of the banknote, and a magnetic sensor that detects magnetic characteristics of the banknote. The banknote recognition apparatus acquires characteristics of the banknote by using these sensors and performs the various recognition processes on the banknote.

For example, Japanese Patent Application Laid-open No. 2006-227951 discloses an apparatus in which a paper sheet is pinched between a transport roller arranged on a transport path and an opposite roller arranged opposing the transport roller, the paper sheet is transported by the transport roller driven by a motor, and various recognition processes are performed on the paper sheet while transporting the paper sheet. Moreover, International Patent publication WO2011/096258 discloses an apparatus in which a magnetic pattern formed on a medium is detected while the medium is being transported by a transport device that includes rollers and guides.

In the conventional apparatuses, however, magnetization is induced in the transport roller, which is made of metal, by a magnet used in the magnetic sensor for detecting magnetism.

Most magnetic sensors use a magnet for detecting magnetism. Concretely, a bias magnetic field is generated around a magnetic sensor by arranging a magnet near the magnetic sensor. Magnetic material, such as a magnetic ink or a magnetic thread, incorporated in a paper sheet is detected based on a magnetic flux change as the magnetic material passes through the bias magnetic field. In such a configuration, for example, the magnet used to magnetize the magnetic material is arranged upstream of the magnetic sensor on the transport path. Although the transport path is supposed to transport only the paper sheets, magnetic metal members, such as paper clips or stapler needles used to bundle banknotes, may be accidentally transported on the transport path. Such magnetic metal members get magnetized when they pass near the magnet arranged along the transport path. If the magnetized metal members may touch the transport roller, the transport roller gets magnetized. A variation of the bias magnetic field around the magnetic sensor is caused by rotation of such a magnetized transport roller. This variation acts as a noise and the detection accuracy of the magnetism by the magnetic sensor is degraded. In order to cope with the recent demand for downsizing the apparatus, the magnet and the transport roller or the transport roller and the magnetic sensor are arranged close to each other. Accordingly, there is a possibility that the transport roller is disadvantageously magnetized when even a small magnetic metal member is transported on the transport path. Moreover, during the maintenance work, if a magnetic screwdriver touches the transport roller by mistake, the transport roller is disadvantageously magnetized.

One approach to address and solve this issue is to use a roller made entirely of a non-magnetic metal; however, the durability of such a roller is disadvantageously low. On the other hand, if a ceramic bearing, which is non-magnetic and has high durability, is used for the transport roller, the cost disadvantageously increases. If a bearing is used for the roller in the transport path, it is desirable to use a metal bearing instead of a ceramic bearing from the viewpoint of cost. Also, it is desirable to use a magnetic metal bearing instead of a non-magnetic metal bearing from the viewpoint of durability. Thus, there is a requirement for a technology that can solve the problem of magnetization of the roller even when a bearing and the like made of magnetic metal that is less expensive but has a high durability is used for the roller.

SUMMARY

The present invention has been made to solve the problems in the conventional technology. One object of the present invention is to present a paper sheet magnetic detection apparatus that can prevent degradation of the magnetism detection accuracy occurring due to a roller used for transporting a paper sheet getting magnetized.

According to an aspect of the present invention, there is provided a paper sheet magnetic detection apparatus that detects a magnetic material in a paper sheet by using a magnetic sensor. The paper sheet magnetic detection apparatus includes a transport path that transports paper sheets one by one; at least one magnet that is used in the detection of the magnetic material by the magnetic sensor; and a plurality of transport rollers that are arranged near the magnetic sensor and that transport the paper sheets on the transport path. Outer peripheral surfaces of the plurality of transport rollers that face the transport path are made of a non-magnetic material.

The above and other objects, features, advantages and the technical and industrial significance of this invention will be better understood by reading the following detailed description of presently preferred embodiments of the invention, when considered in connection with the accompanying drawings.

BRIEF DESCRIPTION OF THE DRAWINGS

FIGS. 2A and 2B are schematic drawings for explaining a structure of a banknote recognition apparatus according to the present embodiment;

DETAILED DESCRIPTION OF EMBODIMENTS

Exemplary embodiments of a paper sheet magnetic detection apparatus according to the present invention are explained in detail below with reference to the accompanying drawings. The paper sheet magnetic detection apparatus according to the present invention can detect a magnetic material embedded in various types of paper sheets such as banknotes, checks and other valuable media; however, the present embodiment will be explained by taking a banknote as an example of the paper sheet. A banknote recognition apparatus is incorporated in a banknote handling apparatus, and the paper sheet magnetic detection apparatus according to the present invention is realized as a function of the banknote recognition apparatus.

Figure 1:
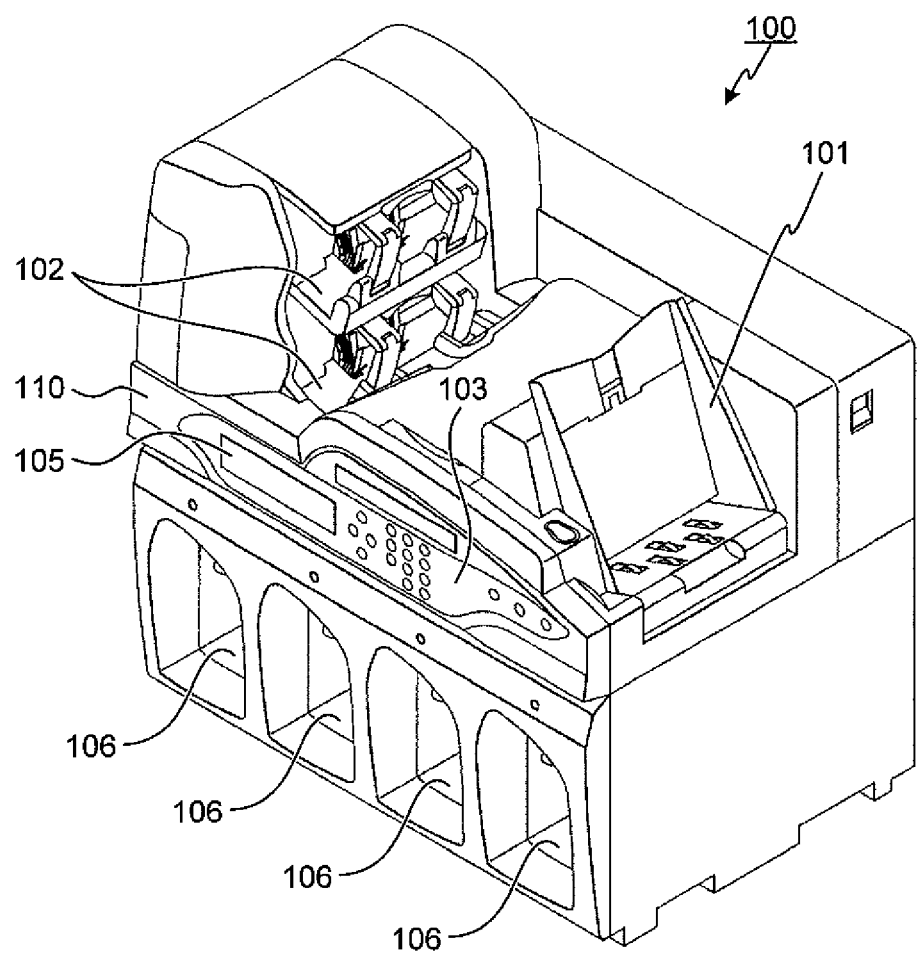
FIG. 1 is a perspective drawing of an outer appearance of a banknote handling apparatus that incorporates a paper sheet magnetic detection apparatus according to the present embodiment.

FIG. 1 is a perspective drawing of a banknote handling apparatus 100 according to the present embodiment. The banknote handling apparatus 100 is a small-size apparatus that can be put on a table top. The banknote handling apparatus 100 includes a hopper 101 for stacking plural banknotes as the handling object, two reject units 102 for discharging rejected banknotes when the banknotes that are taken inside a casing 110 from the hopper 101 are reject banknotes such as counterfeit banknotes and the like, an operating unit 103 used by an operator to input instructions, four stacker units 106 for sorting and stacking normal banknotes whose denomination and authenticity has been recognized inside the casing 110, and a display unit 105 that displays the result of recognition and counting of the banknotes and the stacking state of the stacker unit 106. Banknotes are taken, one by one, in the casing 110 from the hopper 101 and transported along a transport path. The banknote recognition apparatus acquires magnetic information from the banknotes and uses the acquired magnetic information to recognize the denomination and/or the authenticity of the banknotes.

FIGS. 2A and 2B are schematic drawings for explaining a structure of a banknote recognition apparatus 10. FIG. 2A shows an exemplary structure in which a magnet 21 is incorporated in a magnetic sensor 20. FIG. 2B shows an exemplary structure in which, in addition to the magnet 21 incorporated in the magnetic sensor 20, a magnet 24 that magnetizes a magnetic material embedded in a banknote 90 is arranged on the transport path 12. The magnet 24 is on upstream side, in the transport direction of the banknote 90 (indicated by an arrow in the drawing), of the magnet 21. The magnet 24 is used, for example, to align the magnetization direction of the magnetic material in the banknote 90 on the upstream side of the magnet 21.

Arrangement positions or polarity directions of the magnets 21 and 24 with respect to the magnetic sensor 20, shapes and numbers of the magnets 21 and 24 can be selected appropriately based on a type of the magnetic sensor and a magnetism detection method employed by the magnetic sensor 20. In an alternative configuration, for example, the magnet 21 can be arranged outside of but near the magnetic sensor 20. In the structure shown in FIG. 2B, one pair of transport rollers (30a and 40a) is arranged between the magnet 24, which is used for magnetizing, and the magnet 21, which is incorporated in the magnetic sensor 20. However, in an alternative configuration, plural pairs of the transport rollers can be arranged between the magnets 21 and 24. In another alternative configuration, an additional pair of the transport rollers is arranged on the upstream side, on the transport path, of the magnet 24. In still another alternative configuration, the transport rollers can be arranged on both sides, the upstream side and the downstream side in the transport direction (left and right sides in FIGS. 2A and 2B), of each of the magnets 21 and 24, and the magnetic sensor 20.

As shown in FIGS. 2A and 2B, the banknote recognition apparatus 10 is arranged along the transport path 12 on which the banknotes 90 are transported one by one inside the banknote handling apparatus 100. The banknote recognition apparatus 10 includes the magnetic sensor 20 that detects the magnetic characteristics of the banknote 90, a thickness detecting sensor 50 that detects a thickness of the banknote 90, and a line sensor 60 that acquires a transmitted image and a reflection image of both sides, a front surface and a back surface of the banknote 90. The banknote recognition apparatus 10 includes drive rollers 40a and 40b that are arranged along the transport path 12 and that apply a transporting force to the banknote 90, pinch rollers 30a and 30b arranged opposing the drive rollers 40a and 40b, and a hair-planted roller 23 arranged opposing a detection surface of the magnetic sensor 20.

The banknote 90 is transported, when the drive rollers 40a and 40b are rotated, in a state where the banknote 90 is pinched between the pinch rollers and the drive rollers arranged above and below the transport path 12. In order to surely transport the banknote 90, the drive rollers 40a and 40b are arranged such that a distance between the adjacent drive rollers (40a and 40b) is shorter than one half of a length of the banknote 90 in the transport direction of the banknote 90. Concretely, to enable transport of a banknote even if the banknote in a half-folded state is taken inside the apparatus, the adjacent drive rollers are arranged such that a distance therebetween in the transport direction is less than one half of a length in the transport direction of the shortest banknote that can be handled in the banknote handling apparatus 100.

FIGS. 2A and 2B depict a view of the banknote recognition apparatus 10 from a direction that is orthogonal to the transport direction of the banknote 90, therefore, although cannot be seen in these views, the magnetic sensor 20, the thickness detecting sensor 50, and the line sensor 60 actually have a shape that extends in the direction that is orthogonal to the transport direction (vertical to the sheet of the drawing). Accordingly, it is possible to scan an entire surface of the banknote 90 that is being transported on the transport path 12 and acquire various feature amounts relating to the banknote 90. Also, actually plural pairs (for example, four pairs) corresponding to each of pairs (30a and 40a, 30b and 40b) including the pinch rollers 30a and 30b and the drive rollers 40a and 40b are arranged in the direction that is orthogonal to the transport direction.

The magnetic sensor 20 includes the magnet 21 that generates a bias magnetic field, and a magnetic detection element 22. The hair-planted roller 23 having hairy material on its outer peripheral surface firmly presses the banknote 90 to a magnetic head unit, i.e. the magnetic sensor 20, in which the magnetic detection element 22 is provided, to enable detection of the magnetic characteristics of the banknote 90. A shaft member and a roller member of the hair-planted roller 23 are made of a non-magnetic material so that the hair-planted roller 23 is never magnetized. The hairy material is arranged on the outer peripheral surface of the hair-planted roller 23 in order to suppress the effect of static electricity. In a configuration in which the magnetic material of the banknote 90 is magnetized on the upstream side position of the magnetic sensor 20 in the transport direction and then the magnetic sensor 20 detects the magnetic characteristics of the magnetized banknote 90, as shown in FIG. 2B, the magnet 24 used for the magnetization is arranged in addition to the magnet 21 used for generating the bias magnetic field.

As the magnetic detection element 22, for example, any of a magnetoresistive element (MR element), an anisotropic magnetoresistive element (AMR element), a giant magnetoresistive element (GMR element), a tunnel magnetoresistive element (TMR element), and a superconducting quantum interference device element (SQUID element) can be used.

The structures of the thickness detecting sensor 50 and the line sensor 60, the recognition process for recognizing the denomination and the authenticity based on the feature amounts acquired by the various sensors 20, 50, and 60 from the banknote 90 that is taken inside the apparatus from the hopper 101, the process of rejecting the banknote 90 or stacking the banknote 90 in an appropriate stacker unit 106 based on the recognition result, and the like can be performed by using a conventional technology. Therefore, a detailed explanation thereof has been omitted herefrom. Accordingly, the pinch rollers 30a and 30b and the drive rollers 40a and 40b will be explained in detail below. As the pinch rollers 30a and 30b have the same structure and function, except that the pinch roller 30a is arranged upstream and the pinch roller 30b is arranged downstream of the magnetic sensor 20, the pinch rollers 30a and 30b will be collectively referred to as a pinch roller 30 in the following explanation. For the same reason, the drive rollers 40a and 40b will be collectively referred to as a drive roller 40.

Figure 3A:
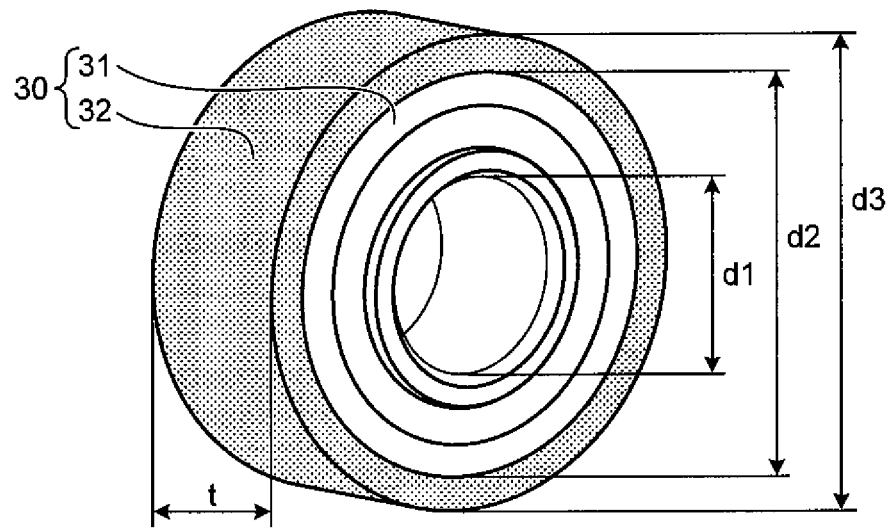
FIGS. 3A and 3B are perspective drawings depicting an outer appearance of a pinch roller and a drive roller.
Figure 3B:
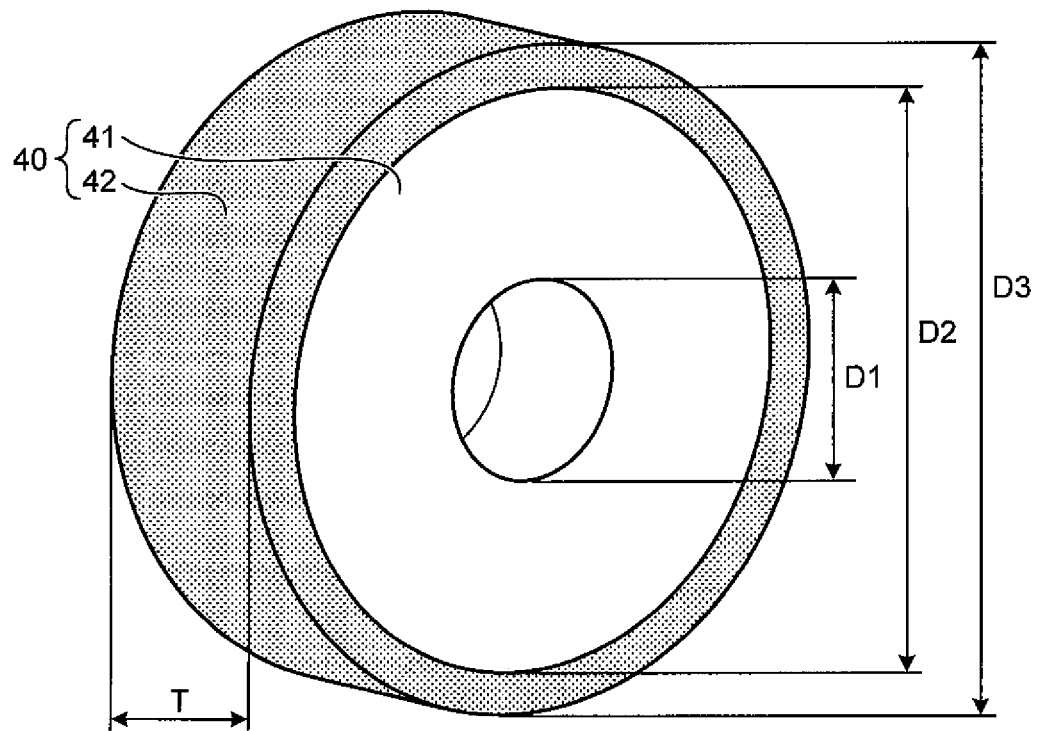

FIGS. 3A and 3B are perspective drawings depicting an outer appearance of the pinch roller 30 and the drive roller 40. The pinch roller 30 shown in FIG. 3A has a two-layer structure in which an outer peripheral member 32 is arranged around a bearing member 31. The bearing member 31 includes ball members between an outer ring and an inner ring. The outer peripheral member 32 is made of a non-magnetic material. The outer peripheral member 32 is firmly attached to an outer peripheral surface of the bearing member 31. The inner ring of the bearing member 31 is firmly attached to a shaft, and thus the outer ring of the bearing member 31 and the outer peripheral member 32 rotate in an integral manner.

Assume that a foreign material, such as a paper clip, made of magnetic metal is accidentally transported on the transport path 12 inside the banknote recognition apparatus 10 shown in FIGS. 2A and 2B, and one part of this foreign material touches the magnet 21 or the magnetic head of the magnetic sensor 20, and the other part touches the outer peripheral surface of the pinch roller 30. Alternatively, assume that the foreign material is magnetized by the magnet 21 and then touches the outer peripheral surface of the pinch roller 30. In any of these cases, the pinch roller 30 is provided so that the foreign material touches only the outer peripheral member 32 and not the bearing member 31.

The outer peripheral member 32 of the pinch roller 30 may indirectly touch the magnet 21 through the foreign material, such as the paper clip.

Therefore, the outer peripheral member 32 is made of a non-magnetic material that will never be magnetized. Because the pinch roller 30 rotates at high speed to transport the banknote 90, a high durability is required for the outer peripheral member 32. Consequently, it is desirable to make the outer peripheral member 32 of a material that is non-magnetic and has high durability.

On the other hand, even if the foreign material, such as the paper clip, is transported on the transport path 12, as the foreign material will never touch the bearing member 31, the bearing member 31 can be made of a magnetic material that has a high durability. Thus, an inexpensive magnetic metal bearing can be used as the bearing member 31.

Concretely, for example, a magnetic metal ball bearing made of a magnetic metal material such as SUS440C stainless steel, which is defined in JIS (Japanese Industrial Standards), can be used as the bearing member 31. On the other hand, polyurethane rubber having a hardness of 90±5 degrees can be used as the outer peripheral member 32.

As the bearing member 31 of the pinch roller 30, for example, as shown in FIG. 3A, a bearing having an inner diameter d1 of 5 millimeters (mm), an outer diameter d2 of 11 mm, and a width t of 5 mm can be used. A 1-mm thick coating of polyurethane is formed on the outer peripheral surface of the outer ring of this bearing as the outer peripheral surface 32. As a result, an outer diameter d3 of the pinch roller 30 will be 13 mm. It is desirable that the thickness of the polyurethane coating is equal to or more than 1 mm when the outer diameter d3 of the pinch roller 30 is between 10 mm and 25 mm, and that the thickness is 2 mm to 3 mm from the viewpoint of durability.

The drive roller 40 shown in FIG. 3B has a two-layer structure in which an outer peripheral member 42 is arranged around a core member 41 made of a non-magnetic material. The core member 41 has a through hole to pass a rotation shaft. The core member 41 is fixed to the rotation shaft, and the core member 41 is fixed to the outer peripheral member 42. Thus, the core member 41 and the outer peripheral member 42 rotate in an integral manner following rotation of the shaft.

Concretely, the core member 41 is made of polyacetal (POM), and the outer peripheral member 42 made of polyurethane rubber having a hardness of 80±5 degrees is arranged around the core member 41 to obtain the drive roller 40. The banknote 90 is transported on the transport path 12 when the drive roller 40 is driven by a driving unit such as a motor. For example, as shown in FIGS. 2A and 2B, the banknote 90 is transported in the direction shown by an outlined arrow when the drive roller 40 is driven in the clockwise direction, and the banknote 90 is transported in the direction that is opposite to the direction shown by the outlined arrow when the drive roller 40 is driven in the counter-clockwise direction. The drive roller 40, in order to surely transport the banknote 90 while rotating at a high speed, includes the core member 41 made of polyacetal to achieve light weight, and the outer peripheral member 42 made of polyurethane rubber to achieve high frictional property and high durability.

The dimensions of the drive roller 40 can be selected depending on the scale of the banknote handling apparatus 100 and the banknote recognition apparatus 10. For example, as shown in FIG. 3B, the core member 41 of the drive roller 40 can have an inner diameter D1 of 6 mm, an outer diameter D2 of 14 mm, and a width T of 5 mm. As the outer peripheral member 42, a 2-mm thick coating of polyurethane is formed on the periphery of the core member 41 to obtain the drive roller 40 having an outer diameter D3 of 18 mm. With regard to the drive roller 40, it is desirable that the thickness of the polyurethane coating is 2 mm to 3 mm when the outer diameter of the drive roller 40 is between 10 mm and 25 mm.

When the outer diameter d3 of the pinch roller 30 shown in FIG. 3A is too small compared to the outer diameter D3 of the drive roller 40 shown in FIG. 3A, jamming tends to occur easily when a banknote enters in between the pinch roller 30 and the drive roller 40. In contrast, when the outer diameter d3 is too large compared to the outer diameter D3, the weight of the pinch roller 30 increases, and this weight acts as a resistance to the drive roller 40. Accordingly, it is desirable that the ratio of the outer diameter d3 to the outer diameter D3, i.e., d3/D3, is between 0.7 and 1.4.

Figure 4:
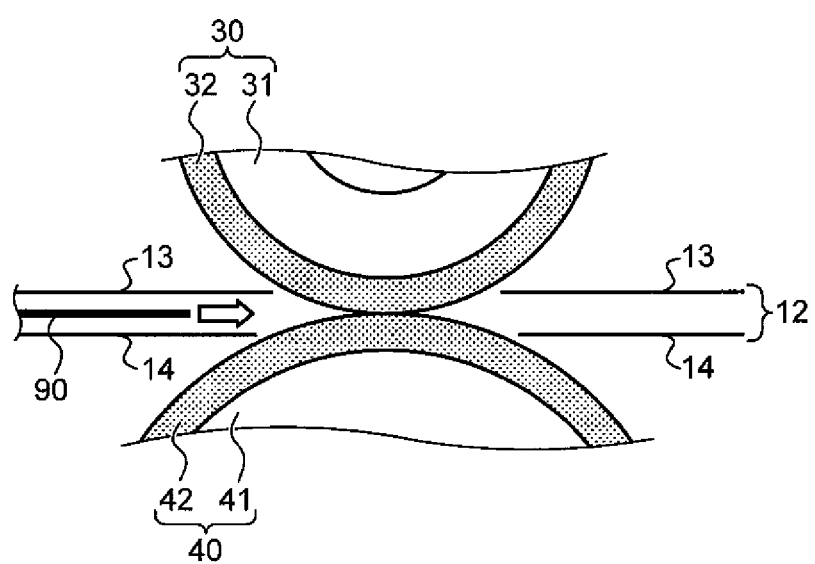
FIG. 4 is a schematic drawing for explaining a positional relationship between the pinch roller and the drive roller and a transport path.

FIG. 4 is a schematic drawing that depicts a positional relationship between the pinch roller 30 and the drive roller 40 and the transport path 12. As shown in FIG. 4, the transport path 12 on which the banknote 90 is transported is formed between an upper guide surface 13 and a lower guide surface 14. The upper guide surface 13 and the lower guide surface 14 are made of a non-magnetic material. An opening is provided in the upper guide surface 13 from where the outer peripheral surface of the pinch roller 30 protrudes toward the transport path 12, and an opening is provided in the lower guide surface 14 from where the outer peripheral surface of the drive roller 40 protrudes toward the transport path 12. The pinch roller 30 and the drive roller 40 are arranged in such a manner that only the outer peripheral surfaces and the side surfaces of the outer peripheral member 32 and the outer peripheral member 42 are exposed inside the transport path 12. The openings in the upper guide surface 13 and the lower guide surface 14 are formed in such a manner that only the outer peripheral member 32 and the outer peripheral member 42 are exposed inside the transport path 12 even in the direction that is orthogonal to the transport direction (vertical to the sheet of the drawing). As a result, even if the foreign material is transported on the transport path 12, the foreign material will only touch the outer peripheral member 32 of the pinch roller 30 and the outer peripheral member 42 of the drive roller 40.

The pinch roller 30 and the drive roller 40 can be arranged closer to the magnetic sensor 20 within a range where the magnetic materials in the pinch roller 30 and the drive roller 40 are not influenced by the bias magnetic field generated by the magnet 21 shown in FIGS. 2A and 2B. For example, when the surface magnetic flux density of the magnet 21 shown in FIG. 2A is 400 millitesla (mT), the distance between the center of the magnetic sensor 20 and the center of the pinch roller 30a arranged upstream of the magnetic sensor 20 on the transport path 12 and the distance between the center of the magnetic sensor 20 and the center of the pinch roller 30b arranged downstream of the magnetic sensor 20 on the transport path 12 can be made as short as 20 mm. Similarly, the distance between the magnet 24 and the pinch roller 30a can be shortened depending on the surface magnetic flux density of the magnet 24. That is, because the distance between the rollers and the magnets 21 and 24 can be made shorter, the banknote recognition apparatus 10 can be downsized in the transport direction as compared to the conventional apparatus.

Furthermore, even if a magnetic screwdriver used during the maintenance work may, by mistake, touches the rollers along the transport path 12, the magnetic screwdriver will touch only the outer peripheral member 32 and the outer peripheral member 42, and never touch the bearing member 31 or the core member 41. In this manner, even if a magnetic material is used in the bearing member 31 or the core member 41, it is possible to reduce the possibility that the magnetic material is magnetized during the maintenance work. Moreover, even if the magnetic material is magnetized by mistake by touching with the magnetic screwdriver, because the outer peripheral member 32 and the outer peripheral member 42 are arranged between the magnetized material and the magnetic sensor 20, the amount of noise generated from the magnetized material that will be detected by the magnetic sensor 20 can be suppressed.

In the structures shown in FIGS. 3A, 3B, and 4, the layers of the outer peripheral member 32 and the outer peripheral member 42 are arranged, respectively, on an outer peripheral surface in a radial direction of the outer ring of the bearing member 31 and on an outer peripheral surface in a radial direction of the outer ring of the core member 41; however, the structure is not limited to those structures. That is, as long as the surfaces of the rollers that may touch the foreign material are made of a non-magnetic material, any other structure can be used. For example, regarding the pinch roller 30, in addition to the outer peripheral surface of the outer ring, a layer of non-magnetic material can be formed on a side surface of the outer peripheral surface of the outer ring of the bearing member 31. Moreover, regarding the drive roller 40, in addition to the outer peripheral surface of the core member 41, a layer of non-magnetic material can be formed on the entire side surface of the core member 41. The method of forming the layer of non-magnetic material is not limited. For example, the layer of non-magnetic material can be formed by adhesion or coating.

Figure 5:
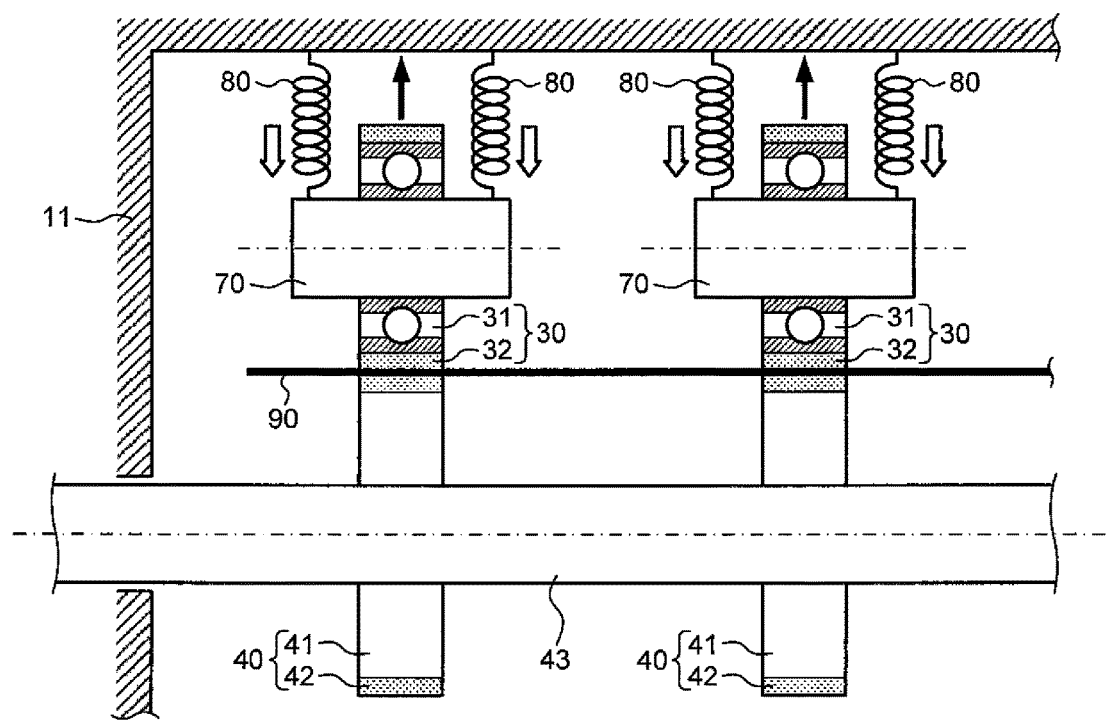
FIG. 5 is a schematic cross-sectional drawing for explaining a support structure of the pinch roller and the drive roller.

A support method for supporting the pinch roller 30 and the drive roller 40 inside the banknote recognition apparatus 10 will be explained below. FIG. 5 is a schematic cross-sectional drawing depicting a support method of the pinch roller 30 and the drive roller 40.

The drive roller 40, which includes the core member 41 and the outer peripheral member 42, is fixed to a rotation shaft 43 that is rotatably supported by a frame 11 of the banknote recognition apparatus 10. Plural drive rollers 40 are fixed to the rotation shaft 43. The rotation shaft 43 is driven to rotate by a motor or the like, and all the drive rollers 40 fixed to the rotation shaft 43 are rotated and transports the banknote 90.

Regarding the pinch roller 30 which includes the bearing member 31 and the outer peripheral member 32, the inner ring of the bearing member 31 is fixed to a movable shaft 70. The outer ring of the bearing member 31 and the outer peripheral member 32 of the pinch roller 30 rotate with the rotation of the opposing drive roller 40. The movable shaft 70 is supported by spring members 80. One end of each of the spring members 80 is fixed to the frame 11 of the banknote recognition apparatus 10 and the other end is fixed to the movable shaft 70, so that the movable shaft 70 can move up and down. The spring members 80 apply a downward pressing force (see the outlined arrows shown in FIG. 5) on the movable shaft 70 whereby the outer peripheral surface of the pinch roller 30 is pressed against the outer peripheral surface of the drive roller 40. If plural banknotes 90 are transported in an overlapping state, or a foreign material such as a paper clip is accidentally transported, the pinch roller 30 is displaced upward (see the solid arrows shown in FIG. 5) along with the movable shaft 70 against the action of the spring members 80. With this structure, it is possible to allow an object that is thicker than the banknote 90 to pass between the pinch rollers 30 and the drive rollers 40, and prevent the surfaces of the pinch roller 30 and the drive roller 40 getting damaged.

The movable shaft 70 is arranged independently for each of the pinch rollers 30. In this structure, when a foreign material is transported on the transport path 12, only the pinch roller 30 under which the foreign material is currently passing will be displaced upward, and the other pinch rollers 30 will hold the banknote 90 by pressing against the corresponding drive rollers 40. Thus, the banknote 90 is surely transported.

Coil springs or plate springs can be used as the spring members 80. As long as the movable shaft 70 of the pinch roller 30 is supported parallel to the rotation shaft 43 of the drive roller 40, the number of the spring members 80 used to support the movable shaft 70 is not limited.

Figure 6:
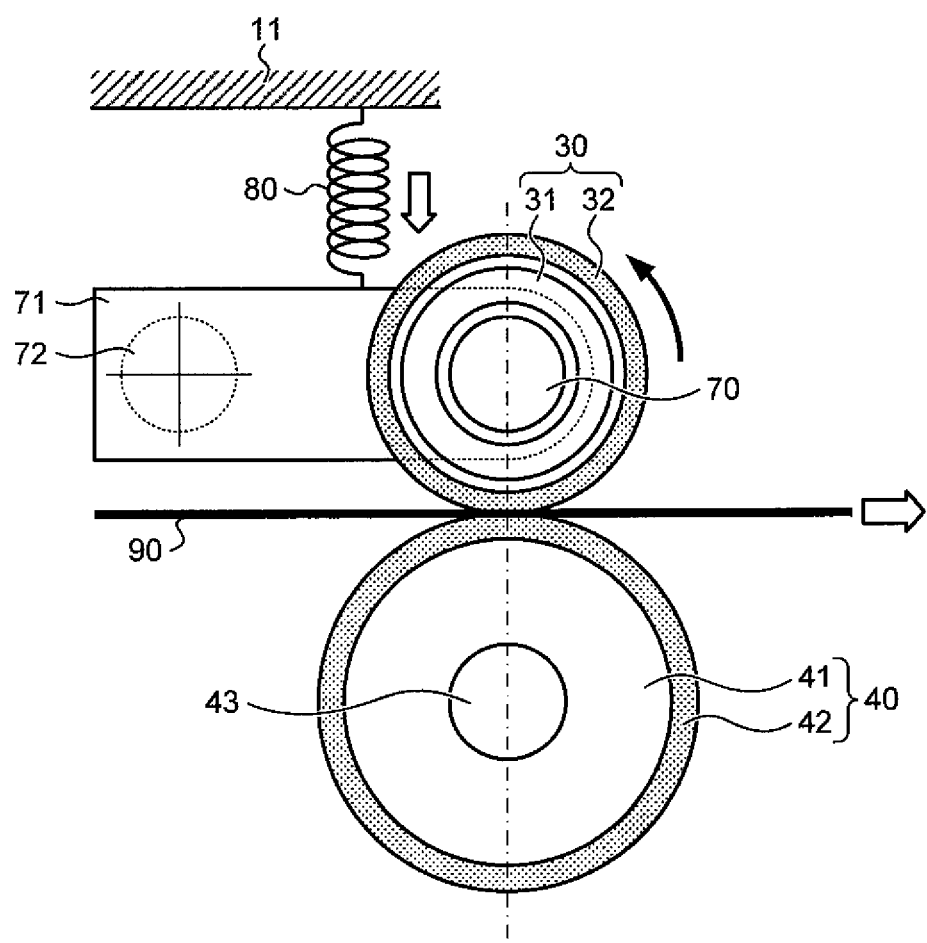
FIG. 6 is a schematic drawing for explaining another support structure of the pinch roller.

FIG. 6 is a schematic drawing depicting another method for supporting the pinch roller 30. The pinch roller 30 is supported by a support member 71. The movable shaft 70 is formed on the front surface side of one side of the support member 71. The support shaft 72 is formed on the back surface of the other side of the support member 71. The movable shaft 70 and the support shaft 72 are attached to a main body of the support member 71 to form an integral structure. The inner ring of the bearing member 31 of the pinch roller 30 is fixed to the movable shaft 70, and the support shaft 72 is rotatably inserted into a hole provided in the frame 11 of the banknote recognition apparatus 10 so that the support member 71 is rotatable with respect to the frame 11. Accordingly, rotation of the support member 71 around the support shaft 72 as the center of rotation will lead to up-down rotation of the movable shaft 70. Because the inner ring of the bearing member 31 of the pinch roller 30 is fixed to the movable shaft 70, the pinch roller 30 can rotate up and down around the support shaft 72 as the center of rotation. In this state, to apply a downward pressing force (see the outlined arrow) on the support member 71, one end of a spring member 80 is fixed to the frame 11 and the other end is fixed at a position in between the support shaft 72 and the movable shaft 70. In this structure, the outer peripheral surface in a radial direction of the pinch roller 30 is pressed against the outer peripheral surface in a radial direction of the drive roller 40. If a foreign material is transported on the transport path 12, the pinch roller 30 is displaced upward (see the solid arrow) as the pinch roller 30 rotates with the support shaft 72 as the center of rotation.

Figure 7:
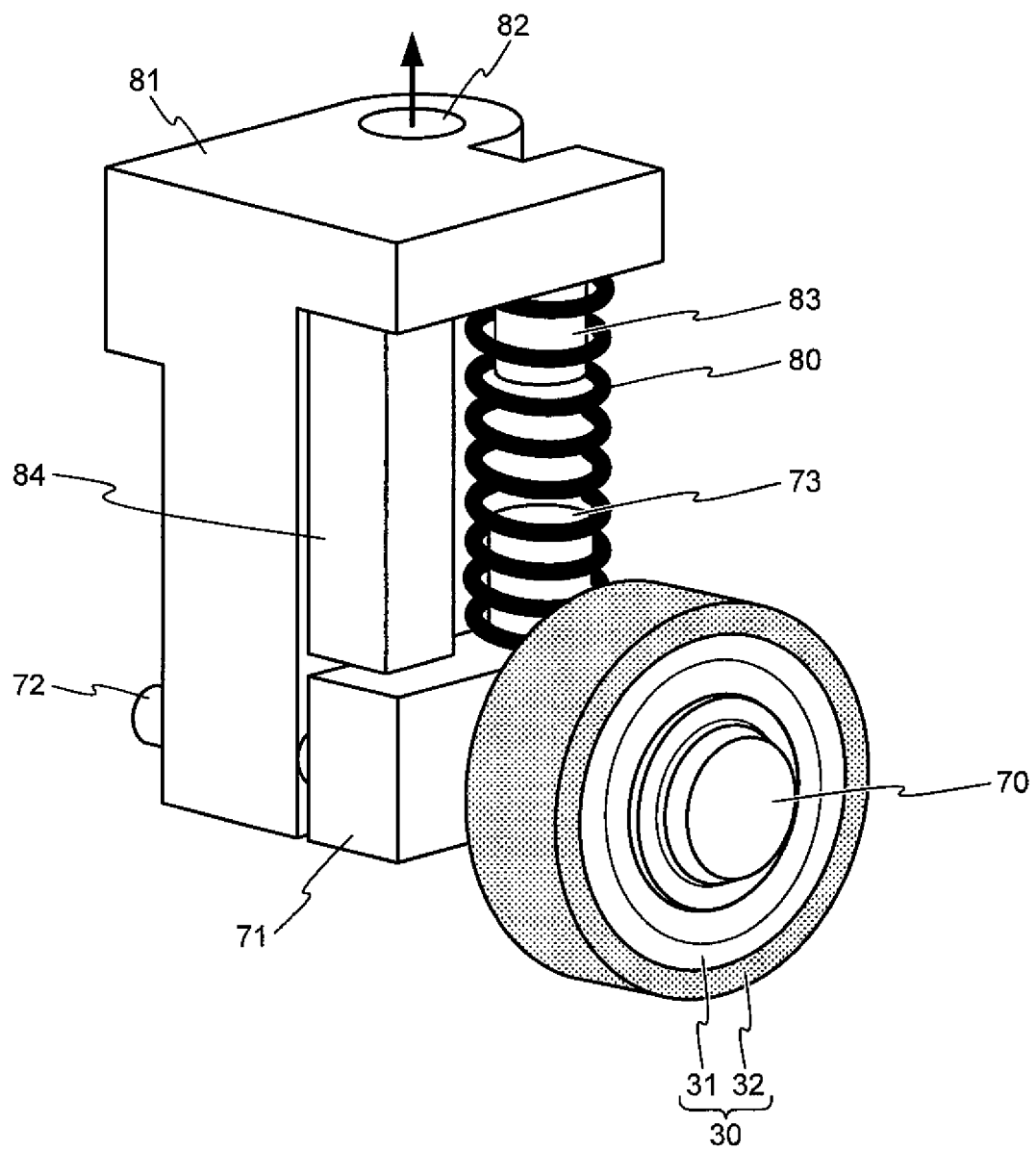
FIG. 7 is a perspective drawing of a pinch roller unit that realizes the support structure of the pinch roller shown in FIG. 6.

FIG. 7 is a perspective drawing that depicts an example of a pinch roller unit that realizes the support structure of the pinch roller 30 shown in FIG. 6. The pinch roller unit includes a fixing member 81 that is fixed to the frame 11 of the banknote recognition apparatus 10. A through hole 82 is formed in an upper portion of the fixing member 81. A stopper member 84 that limits a rotation range of the support member 71 is arranged on a side surface of the fixing member 81. A fixing screw is tightened through the through hole 82 from a lower side thereof as shown with an arrow, and the fixing member 81 is fixed to the banknote recognition apparatus 10. Another hole is provided in a lower portion of the fixing member 81. The support shaft 72 of the support member 71 is inserted into this hole and supported rotatably. The inner ring of the pinch roller 30 is inserted into the movable shaft 70 of the support member 71 and fixed. A protruding member 83 is arranged integrally on the fixing member 81. A protruding member 73 is arranged in an opposite position of the protruding member 83, integrally on the support member 71. The spring member 80, which is a compression coil spring, is installed between the protruding member 83 and the protruding member 73. Thus, the compression coil spring presses the pinch roller 30 downward.

As explained above, in the banknote recognition apparatus 10 according to the present embodiment, i.e., in the paper sheet magnetic detection apparatus according to the present invention, the pinch roller 30 includes the bearing member 31 made of a magnetic material and the outer peripheral member 32 made of a non-magnetic material, and the pinch roller 30 is arranged in such a manner that only the outer peripheral member 32 is exposed on the transport path 12. Accordingly, even if a magnetic metal member, such as a paper clip, is accidentally transported on the transport path 12, and the magnetic metal member stays between the magnetic sensor 20 and the pinch roller 30 on the transport path 12, the bearing member 31 of the pinch roller 30 will never be magnetized. As a result, a bearing made of an inexpensive magnetic stainless steel can be used as the bearing member 31 of the pinch roller 30 that requires high durability. Moreover, as the pinch roller 30 is never magnetized, no magnetic noise is generated due to the rotation of the pinch roller 30, and therefore, no degradation will occur in the detection accuracy of the magnetic material by the magnetic sensor 20.

Moreover, as the outer peripheral surfaces, which face the transport path 12, of all the rollers including the hair-planted roller 23, the pinch roller 30, and the drive roller 40 arranged around the magnetic sensor 20 are formed of a non-magnetic material, these rollers will never be magnetized, and therefore, no degradation will occur in the detection accuracy of the magnetic material by the magnetic sensor 20. Furthermore, because no measures such as arranging the magnetic sensor 20 away from the rollers to avoid the rollers getting magnetized are required to be taken, the banknote recognition apparatus 10, i.e., the paper sheet magnetic detection apparatus, can be downsized.

Moreover, as polyurethane rubber made of an elastic material is used as the non-magnetic material to form the outer peripheral member 32 of the pinch roller 30 and the outer peripheral member 42 of the drive roller 40, sound or vibration noise generated when the banknote 90 being transported on the transport path 12 thrusts in between the pinch roller 30 and the drive roller 40 can be reduced.

According to an aspect of the present invention, a paper sheet magnetic detection apparatus that detects a magnetic material in a paper sheet by using a magnetic sensor includes a transport path that transports paper sheets one by one; at least one magnet that is used in the detection of the magnetic material by the magnetic sensor; and a plurality of transport rollers that are arranged near the magnetic sensor and that transport the paper sheets on the transport path. Outer peripheral surfaces of the plurality of transport rollers that face the transport path are made of a non-magnetic material.

According to another aspect of the present invention, in the above paper sheet magnetic detection apparatus, the magnet is incorporated in the magnetic sensor.

According to still another aspect of the present invention, in the above paper sheet magnetic detection apparatus, the magnet aligns a magnetization direction of the magnetic material in the paper sheet when the paper sheet is on the upstream side of the magnetic sensor in a transport direction of the paper sheet.

According to still another aspect of the present invention, in the above paper sheet magnetic detection apparatus, the plurality of transport rollers include a roller that includes an inner member made of a magnetic material and an outer member made of a non-magnetic material arranged around an outer peripheral surface of the inner member.

According to still another aspect of the present invention, in the above paper sheet magnetic detection apparatus, the plurality of transport rollers include a pinch roller that includes a bearing made of magnetic stainless steel and an outer member made of a non-magnetic material arranged around an outer peripheral surface of the inner member.

According to still another aspect of the present invention, in the above paper sheet magnetic detection apparatus, the non-magnetic material is made of an elastic material.

According to still another aspect of the present invention, in the above paper sheet magnetic detection apparatus, the non-magnetic material is polyurethane rubber.

According to still another aspect of the present invention, in the above paper sheet magnetic detection apparatus, a hardness of the non-magnetic material is in a range of 85 degrees to 95 degrees.

According to still another aspect of the present invention, in the above paper sheet magnetic detection apparatus, the plurality of transport rollers include a first roller and a second roller, the first roller and the second roller pinch the paper sheet when transporting the paper sheet, and the first roller is supported in such a manner that the first roller can be displaced depending on a thickness of the paper sheet.

According to still another aspect of the present invention, in the above paper sheet magnetic detection apparatus, a ratio of outer diameters of the first roller and the second roller is in a range of 0.7 to 1.4.

According to still another aspect of the present invention, in the above paper sheet magnetic detection apparatus, a distance between the adjacent rollers included in the plurality of transport rollers is less than one half of a length of the paper sheet to be handled in the transport direction of the paper sheet.

According to an aspect of the present invention, in a structure where a magnetic sensor incorporates a magnet, or a magnet for magnetizing the magnetic material is arranged separately from the magnetic sensor, because an outer peripheral surface of transport rollers that faces a transport path is made of a non-magnetic material, even if a foreign material, such as a paper clip, is accidentally transported on the transport path, a disadvantageous situation where the transport rollers get magnetized when the transport rollers made of a magnetic material indirectly touch the magnet via the foreign material does not occur. As a result, because no magnetic noise is generated due to magnetization of the transport roller, no degradation will occur in the detection accuracy for the magnetic detection.

According to another aspect of the present invention, because a non-magnetic material having elasticity is arranged on the outer peripheral surfaces of the transport rollers, vibration noise, which is generated when a paper sheet thrusts in between upper and lower transport rollers and superimposes on a magnetic signal, can be reduced.

According to still another aspect of the present invention, because pinch rollers for transporting paper sheets are formed by arranging a layer of polyurethane rubber on an outer peripheral surface of a bearing made of magnetic stainless steel, in addition to avoiding magnetization of the transport rollers, it is possible to realize highly durable and inexpensive transport rollers.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching of the claims.

We claim:

1. A paper sheet magnetic detection apparatus that detects magnetic material in paper sheets, comprising:
   a transport path that transports the paper sheets one by one;
   a magnetic sensor that detects the magnetic material;
   at least one magnet that is arranged on one face side of the transport path and generates a bias magnetic field for the magnetic sensor;
   a drive roller that includes an outer peripheral member made of a non-magnetic material arranged on an outer peripheral surface of a core member of the drive roller, the drive roller is arranged near the magnetic sensor on another face side of the transport path and applies a transporting force to each of the paper sheets on the transport path;
   a pinch roller that includes a bearing member made of a magnetic material and an outer peripheral member made of a non-magnetic material arranged on an outer peripheral surface of the bearing member, the pinch roller is arranged on the one face side opposing the drive roller,
   wherein
   the transport path is formed between a first guide surface made of a non-magnetic material and a second guide surface made of a non-magnetic material and the paper sheets are transported between the first guide surface and the second guide surface,
   the pinch roller is arranged in such a manner that only an outer peripheral surface and side surfaces of the outer peripheral member of the pinch roller are exposed through an opening provided in the first guide surface, and
   the drive roller is arranged in such a manner that only an outer peripheral surface and side surfaces of the outer peripheral member of the drive roller are exposed through an opening provided in the second guide surface.

2. The paper sheet magnetic detection apparatus according to claim 1, wherein the non-magnetic material of the pinch roller and the drive roller is polyurethane rubber.

3. The paper sheet magnetic detection apparatus according to claim 1, further comprising:
   a first shaft of the drive roller;
   a second shaft of the pinch roller; and
   a spring that supports the second shaft, and applies a pressing force to the second shaft such that the outer peripheral member of the pinch roller is pressed against the outer peripheral member of the drive roller, and the pinch roller moves up and down in response to one of the paper sheets passing between the pinch roller and the drive roller.

4. The paper sheet magnetic detection apparatus according to claim 1, further comprising:
   a first shaft of the drive roller;
   a second shaft of the pinch roller;
   a support member that supports the second shaft;
   a third shaft that supports the support member so that the support member rotates about the third shaft; and
   a spring that applies a pressing force to the support member such that the outer peripheral member of the pinch roller is pressed against the outer peripheral member of the drive roller, and the pinch roller moves up and down by rotating the support member in response to one of the paper sheets passing between the pinch roller and the drive roller.

5. A paper sheet recognition apparatus comprising:
   the paper sheet magnetic detection apparatus according to claim 1, and
   a hopper configured to receive and dispense the paper sheets to the transport path.

6. A paper sheet magnetic detection apparatus that detects magnetic material in paper sheets, comprising:

a transport path that transports the paper sheets one by one;

a magnetic sensor that detects the magnetic material;

at least one magnet that is arranged on one side of the transport path and generates a bias magnetic field for the magnetic sensor;

a first drive roller that includes an outer peripheral member made of a non-magnetic material arranged on an outer peripheral surface of a core member of the first drive roller, the first drive roller is arranged on another side of the transport path, and applies a transporting force to each of the paper sheets on the transport path;

a first pinch roller that includes a first bearing member made of a magnetic material and an outer peripheral member made of a non-magnetic material arranged on an outer peripheral surface of the first bearing member, the first pinch roller is arranged on the one side on which the at least one magnet is arranged, and opposes the first drive roller, wherein an outer diameter of the first pinch roller is smaller than an outer diameter of the first drive roller, the transport path is formed between a first guide surface made of a non-magnetic material and a second guide surface made of a non-magnetic material and the paper sheets are transported between the first guide surface and the second guide surface, the first pinch roller is arranged in such a manner that only an outer peripheral surface and side surfaces of the outer peripheral member of the first pinch roller are exposed through an opening provided in the first guide surface, and the first drive roller is arranged in such a manner that only an outer peripheral surface and side surfaces of the outer peripheral member of the first drive roller are exposed through an opening provided in the second guide surface.

7. The paper sheet magnetic detection apparatus according to claim 6, wherein the non-magnetic material of the first pinch roller and the non-magnetic material of the first drive roller is polyurethane rubber.

8. The paper sheet magnetic detection apparatus according to claim 6, further comprising:

a first shaft of the first drive roller;

a second shaft of the first pinch roller; and a spring that supports the second shaft, and applies a pressing force to the second shaft such that the outer peripheral member of the first pinch roller is pressed against the outer peripheral member of the first drive roller, and the first pinch roller moves up and down in response to one of the paper sheets passing between the first pinch roller and the first drive roller.

9. The paper sheet magnetic detection apparatus according to claim 6, further comprising:

a first shaft of the first drive roller;

a second shaft of the first pinch roller;

a support member that supports the second shaft;

a third shaft that supports the support member such that the support member rotates about the third shaft; and a spring that applies a pressing force to the support member such that the outer peripheral member of the first pinch roller is pressed against the outer peripheral member of the first drive roller, and the first pinch roller moves up and down by rotating the support member in response to one of the paper sheets passing between the first pinch roller and the first drive roller.

10. A paper sheet recognition apparatus comprising:

the paper sheet magnetic detection apparatus according to claim 6, and a hopper configured to receive and dispense the paper sheets to the transport path.

11. The paper sheet magnetic detection apparatus according to claim 6, wherein the outer diameter of the first drive roller is between 10 mm and 25 mm, and a thickness of the outer peripheral member of the first drive roller is 2 mm to 3 mm.

12. The paper sheet magnetic detection apparatus according to claim 7, wherein the core member is made of polyacetal, and the non-magnetic material arranged on the outer peripheral surface of the core member is arranged on and completely covers the outer peripheral surface of the core member.

13. The paper sheet magnetic detection apparatus according to claim 6, wherein the outer diameter of the first pinch roller is between 10 mm and 25 mm, and a thickness of the outer peripheral member of the first pinch roller is greater than or equal to 1 mm.

14. The paper sheet magnetic detection apparatus according to claim 6, further comprising:

a second drive roller that includes an outer peripheral member made of a non-magnetic material arranged on an outer peripheral surface of a core member of the second drive roller, the second drive roller is arranged on the another side of the transport path, and applies a transporting force to each of the paper sheets on the transport path; and a second pinch roller that includes a second bearing member made of a magnetic material and an outer peripheral member made of a non-magnetic material arranged on an outer peripheral surface of the second bearing member, the second pinch roller is arranged on the one side on which the at least one magnet is arranged, and opposes the second drive roller, wherein the first drive roller and the first pinch roller are arranged upstream of the magnetic sensor in a transport direction, and the second drive roller and the second pinch roller are arranged downstream of the magnetic sensor in the transport direction, the second pinch roller is arranged in such a manner that only an outer peripheral surface and side surfaces of the outer peripheral member of the second pinch roller are exposed through an opening provided in the first guide surface, and the second drive roller is arranged in such a manner that only an outer peripheral surface and side surfaces of the outer peripheral member of the second drive roller are exposed through an opening provided in the second guide surface.

15. The paper sheet magnetic detection apparatus according to claim 7, wherein the magnetic material of the first bearing member is stainless steel.

\* \* \* \* \*